(12) United States Patent
Heanue

(10) Patent No.: US 12,426,397 B2
(45) Date of Patent: *Sep. 23, 2025

(54) SYSTEM AND METHODS FOR MANAGING HEAT IN A PHOTONIC INTEGRATED CIRCUIT

(71) Applicant: ACACIA TECHNOLOGY, INC., San Jose, CA (US)

(72) Inventor: John Heanue, Manchester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/099,462

(22) Filed: Jan. 20, 2023

(65) Prior Publication Data

US 2023/0155053 A1     May 18, 2023

Related U.S. Application Data

(63) Continuation of application No. 16/929,850, filed on Jul. 15, 2020, now Pat. No. 11,563,136.

(51) Int. Cl.
| | | |
|---|---|---|
| *H10F 55/00* | (2025.01) | |
| *H10F 77/00* | (2025.01) | |
| *H10F 77/50* | (2025.01) | |
| *H10F 77/60* | (2025.01) | |

(52) U.S. Cl.
CPC ............. *H10F 55/00* (2025.01); *H10F 77/50* (2025.01); *H10F 77/60* (2025.01); *H10F 77/933* (2025.01)

(58) Field of Classification Search
None
See application file for complete search history.

(56) References Cited

U.S. PATENT DOCUMENTS

| | | | |
|---|---|---|---|
| 6,107,630 A * | 8/2000 | Mazurowski | H01L 31/024 250/336.1 |
| 2005/0214957 A1 | 9/2005 | Kihara et al. | |
| 2010/0119231 A1 | 5/2010 | Kim et al. | |
| 2013/0308898 A1* | 11/2013 | Doerr | G02B 6/12 385/14 |

FOREIGN PATENT DOCUMENTS

WO    2019/006238 A1    1/2019

OTHER PUBLICATIONS

PCT International Search Report and PCT Written Opinion for PCT International Patent Application No. PCT/US2021/041615; mailing date Oct. 7, 2021; (12 pages).

* cited by examiner

*Primary Examiner* — Sarah K Salerno
(74) *Attorney, Agent, or Firm* — Patterson + Sheridan LLP

(57) ABSTRACT

In part, in one aspect, the disclosure relates to a system including a photonic integrated circuit (PIC) assembly, comprising a PIC comprising: a first bond pad disposed inward from an edge of the PIC a first distance; and a first wire having a first length, the first wire electrically connected to the first bond pad and extending therefrom, wherein the first distance is greater than 0.4 mm.

9 Claims, 6 Drawing Sheets

SYSTEM AND METHODS FOR MANAGING HEAT IN A PHOTONIC INTEGRATED CIRCUIT

CROSS REFERENCE TO RELATED APPLICATIONS

This application is a continuation application which claims priority to and the benefit of U.S. patent application Ser. No. 16/929,850 filed on Jul. 15, 2020, the disclosure of which is herein incorporated by reference in its entirety.

FIELD

This disclosure relates generally to the field of photonic integrated circuits.

BACKGROUND

Contemporary optical communications and other photonic systems make extensive use of photonic integrated circuits that are advantageously mass-produced for various purposes. These circuits and the components they include and/or connect to are often sources of thermal energy. Managing thermal energy helps enhance device operation and the longevity of various components.

The disclosure includes various methods and system to advantageously manage thermal energy and addresses other challenges as discussed below.

SUMMARY

In part, in one aspect, the disclosure relates to a system including a photonic integrated circuit (PIC) assembly, comprising a PIC comprising: a first bond pad disposed inward from an edge of the PIC a first distance; and a first wire having a first length, the first wire electrically connected to the first bond pad and extending therefrom, wherein the first distance is greater than about 0.4 mm.

In one embodiment, the system further comprises where the first length is selected to thermally isolate one or more components of the PIC such that during operation temperature variation of PIC ranges from about 49 degrees to about 51 degrees. In one embodiment, the system further comprises where the first length ranges from about 0.4 mm to about 2 mm. In one embodiment, the system further comprises a housing including an outer surface; and an inner surface defined by a volume of the PIC assembly. In one embodiment, the system further comprises where the housing further includes pins extending outward from the outer surface of the housing and connectors along the interior surface of the housing electrically connected to the pins.

In one embodiment, the system further comprises where the first length is greater than the distance between the first bond pad to a first connector of the connectors, wherein the first connector is associated with the first bond pad. In one embodiment, the system further comprises where the length of the wire bonds are about three times the distance between the PIC assembly and the interior wall of the housing. In one embodiment, the system further comprises where the PIC further includes a first region affected by a level of heat proximate to the first region; and wherein the first region is disposed distally from each of the bond pads. In one embodiment, the system further comprises where the PIC assembly further includes a thermo-electric cooler (TEC), wherein the PIC is coupled to the TEC; a thermistor disposed on the PIC configured to provide feedback to the TEC based on a temperature detected by thermistor; and a laser diode optically connected to the PIC.

In one aspect, the disclosure relates to a method of manufacturing an optical transceiver, the method including providing a housing comprising an interior surface and exterior surface; a plurality of pins extending outward from the exterior surface of the housing; an interior volume at least partially enclosed within the housing; and a plurality of connectors along the interior surface of the housing electrically connected to the plurality of pins; coupling a PIC assembly to the packaging within the interior volume of the packaging, wherein the PIC assembly includes a plurality of bond pads; and electrically connecting each of the bond pads uniquely to a connector of the plurality of connectors along the interior surface of the housing with a bonding wire at least partially rounded across the distance between each of the bond pads and the associated connector, wherein a length of the bond wire is greater than a distance between each of the bond pads and the associated connector.

In one embodiment, the method further comprises where the PIC assembly includes a PIC comprising the plurality of bond pads, wherein the bond pads are disposed inward from an edge of the PIC. In one embodiment, the method further comprises where the PIC assembly includes a PIC comprising the plurality of bond pads, wherein the bond pads are disposed towards the center of the PIC. In one embodiment, the method further comprises where the PIC assembly includes a PIC comprising a region affected by a level of heat proximate to the region, wherein the region is disposed distally from each of the bond pads.

Although, the disclosure relates to different aspects and embodiments, it is understood that the different aspects and embodiments disclosed herein can be integrated, combined, or used together as a combination system, or in part, as separate components, devices, and systems, as appropriate. Thus, each embodiment disclosed herein can be incorporated in each of the aspects to varying degrees as appropriate for a given implementation. Further, the various apparatus, optical elements, electro-optical devices, inputs, outputs, ports, channels, conductive elements, bond pads, wires, assemblies, PIC assemblies, wire bonds, heat sources, heat sinks, thermistors, control systems, connectors, components and parts of the foregoing disclosed herein can be used with any laser, laser-based communication system, waveguide, fiber, transmitter, transceiver, receiver, and other devices and systems without limitation.

These and other features of the applicant's teachings are set forth herein.

BRIEF DESCRIPTION OF THE FIGURES

Unless specified otherwise, the accompanying drawings illustrate aspects of the innovations described herein. Referring to the drawings, wherein like numerals refer to like parts throughout the several views and this specification, several embodiments of presently disclosed principles are illustrated by way of example, and not by way of limitation. The drawings are not intended to be to scale. A more complete understanding of the disclosure may be realized by reference to the accompanying drawings in which.

DETAILED DESCRIPTION

Figure 1:
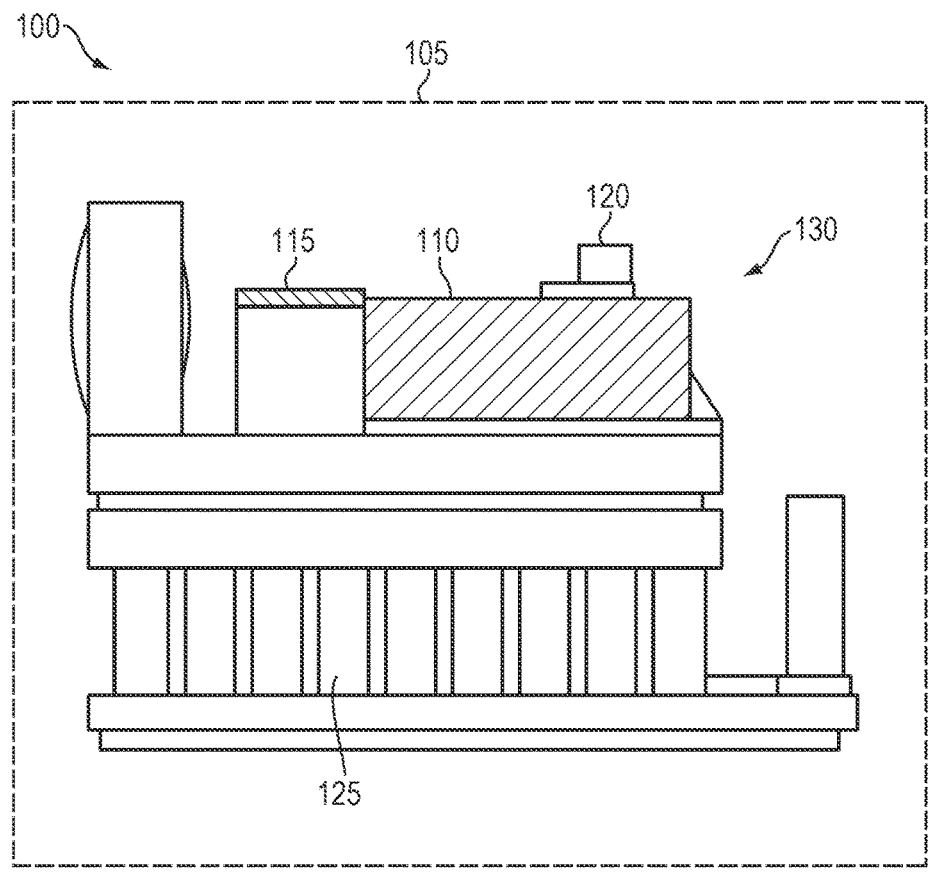
FIG. 1 illustrates a high level diagram of a laser package with an integrated photonic integrated circuit (PIC) assembly within a housing, in accordance with one or more embodiments of the disclosure.

In part, the disclosure relates to heat management relative to photonic temperature sensitive devices such as electrical, optical, and/or optoelectronic circuits, devices and the housings and electrical conducting elements associated therewith. In various embodiments, a housing may also be referred to as a package in various embodiments such as an integrated circuit package. In many embodiments, the disclosure may enable design, creation, and/or implementation of a housing and electrical connections that reduces or minimizes thermal losses such as thermal cross talk relative to one or more of a housing, a photonic integrated circuit (PIC) disposed within the housing and the environment in which the housing is located. In some embodiments, the length of various wires or other conductive elements may be advantageously increased by adjusting the position of the connection points of the ends of given wire. In turn, in these embodiments, such an increase in wire length or the length of the applicable conducting element may result in an increase in thermal resistance, which in turn, may mitigate heat transfer between the PIC and the load it is connected to over a given wire length.

In various embodiments, a PIC may include a die that include includes a substrate such as a semiconductor material. In various embodiments, a laser package may include a PIC implemented relative to a silicon photonics die or other semiconductor die. In certain embodiments, a PIC may include one or more laser wavelength tuning elements or other temperature sensitive elements. In these embodiments, a change or shift in thermal transfer or leakage from a housing may improve a PIC's ability to modulate a laser input with precision. In various embodiments, placement of bond pads and connecting wire bonds may be operable to reduce the thermal cross talk.

For example, in some embodiments, the effects of thermal cross talk on components of a PIC may be mitigated by placement of bond pads and associated wire connectors relative to a geometric feature of the housing such as a boundary or perimeter of one side or surface of the housing. In some embodiments, by offsetting a given node or electrical connection relative to the die, the length of the conductive path may increase. In many embodiments, a path increase may result in an increase in thermal resistance. Thus, in one embodiment, thermal insulation of a PIC-based device is increased by increasing overall length of one or more conductors.

Typically, a temperature of a PIC assembly is not uniform across the PIC. Traditionally, current methods of managing thermal leakage use electronic controls to calibrate and/or compensate for thermal cross talk, without regard for geometric positioning of electrical contacts and length of conductive elements. Traditionally, electronic calibration of tuning of a laser requires periodic modification based on a measured case/housing temperature. Typically, when there is a lot of thermal cross talk, the calibration of a laser is subject to a large amount of error. This arises because of the temperature sensitive nature of various lasers.

In most embodiments, one or more portions of a PIC may be sensitive to temperature. In some embodiments, the PIC may include one or more semiconductor materials that exhibit changes in their behavior as a result of temperature changes. For example, wavelength tuning elements that are fabricated as part of the PIC using silicon may experience undesirable changes in their operation as a result of temperature changes. In these embodiments, changes in temperature may cause an optical index of refraction to change, which may affect the ability of the PIC to precisely modulate a laser input. In various embodiments, to maintain accurate control of a laser or when attempting to shift wavelengths, maintaining a consistent temperature is often an advantageous design feature.

In certain embodiments, when temperature and/or thermal cross talk is ignored, a laser may be less accurate in setting a target wavelength. In these embodiments, the target wavelength may potentially drift off target (due to temperature fluctuations). Additionally, in these embodiments, an increase in thermal cross talk may increase an amount of error when modulating a laser input. In addition, Applicant has realized that the longevity of a given PIC component can be shortened based on unwanted thermal energy transfers. Various embodiments of the disclosure may compensate for some or all of the foregoing by adjusting placement of conductive element end points and thereby increasing the length of such conductive elements. In some embodiments, mitigation of thermal crosstalk may be achieved using wires and bonds pads and other conductive elements in conjunction with the teachings disclosed herein.

In various embodiments, Applicant has found that the effects of thermal cross talk may be affected by the location of bond pads and the length of wire bonds between a PIC and its housing. In these embodiments, thermal cross talk may be reduced by implementing a PIC design where the bond pads, and associated wire bonds, are moved inwards from an edge of the PIC. In these embodiments, the inward location of the wire bonds may allow the wires to have an extended length, which may improve thermal properties of the laser package and/or the PIC itself. Additionally, in certain embodiments, the effectiveness of reducing thermal cross talk, through wire bond placement, may increase when more connection points and more wires of increased length are used to extend from a PIC and its housing.

In various embodiments, the bond pads being closer to the center of a given die may enable creating longer wire bonds with the housing, which may cause wire bonds to be more thermally resistant or otherwise suitable for mitigating unwanted heat transfer. In these embodiments, the longer wires provide more separation between the PIC and the housing reducing the overall temperature and variability of the temperature of the PIC. In a preferred embodiment, length of the wire bonds may be long enough to allow for thermal isolation while short enough to reduce the risks of shorting across two or more connections. For example, in an embodiment where wires connecting a housing to a PIC are too long, the PIC may become sensitive to vibrations. In these embodiments, the wires could potentially oscillate back and forth risking a short circuit.

In various embodiments, a PIC assembly may include a PIC and a laser chip placed on a thermo-electric cooler (TEC). In certain embodiments, one or more thermistors may be attached to one or more portions of the PIC assembly to determine a temperature level proximate to each respective thermistor. For example, in an embodiment, a thermistor may be disposed on the PIC itself to determine a temperature for one or more areas or portions of the PIC. In many embodiments, a thermistor may communicate and/or control an activity level of a TEC to manage the temperature of one or more areas of a PIC assembly and/or one or more areas within the PIC itself. In some embodiments, a PIC assembly may set a temperature for a system, which is monitored by a thermistor. In these embodiments, the thermistor manages a thermos-electric cooler (TEC) to manage the temperature of the PIC assembly.

In many embodiments, a laser chip implemented on a PIC assembly may be a tunable laser. In various embodiments, a tunable laser may include a C-band laser. In other embodiments, a tunable laser may include an L-band laser. In various embodiments, of or more techniques of the disclosure may apply to any device that may require the temperature to be controlled through thermal isolation such as, but not limited to, photo detectors, modulators, and/or laser elements. In some embodiments, one or more portions of a PIC may be heat sensitive. In these embodiments, the one or more heat sensitive portions of the PIC may be placed further away from each of the bond pads. For example, in various embodiments, thermal cross talk may be worse near the wire bond and/or pad contacts on a PIC.

In various embodiments, the disclosure may describe methods, systems, and/or apparatus' for lengthening a conducting element such as a wire, trace, or wire bond by up to 50% of the length of such a conducting element in a traditional PIC. In various embodiments, a conducting element such as a wire, trace, or wire bond may be lengthened by up to three times the length of such a conducting element in a traditional PIC. Typically, an integrated circuit has a wire length of about ¾ of a millimeter. Generally, a wire length is measured from where a wire touches a package to where the wire touches a PIC. However, in some embodiments, a modified PIC configuration may be able to lengthen a wire connection between the PIC and the housing to about 1.5 millimeters. In one embodiment, wires, traces or other conductive elements used in conjunction with a temperature sensitive device as disclosed herein range in length from about 1 mm to about 3 mm. In another embodiment, lengths of conductive elements range from about 1 mm to about 8 mm. In one embodiment, a reduction in thermal cross talk is inversely proportion to length of conducting element. For example, doubling length of a conducting element, such as a wire, may halve the amount of heat transfer as a result of the increased resistance. In one embodiment, a given die has a length and a width. In some embodiments, a given die width may range from about 1.5 mm to about 8 mm. In other embodiments, a given die length may range from about 1.5 mm to about 8 mm. In certain embodiments, a distance from an edge of a die to an electrical contact from which a wire extends ranges from about 0.1 mm to about 1.0 mm.

Refer to the example embodiment of FIG. 1, which illustrates a system for integrating a PIC assembly within packaging, in accordance to one or more embodiments of the disclosure. As shown in FIG. 1, the laser system 100 includes housing 105 and photonic integrated circuit (PIC) assembly 130. The PIC assembly 130 includes a PIC 110, a laser chip 115, a thermo-electric cooler (TEC) 125, and a thermistor 120. In this embodiment, the TEC 125 cools the laser chip 115 and the PIC 110 based on feedback from the thermistor 120. If a temperature detected by the thermistor 120 exceeds a pre-set value, the TEC 125 actively cools the PIC assembly 130. Various components within the PIC 110 of the PIC assembly 130 are sensitive to temperature. Thermal crosstalk from the housing 105 is enabled to be managed based on a placement and length of leads connecting the housing 105 to the PIC assembly 130.

Figure 2:
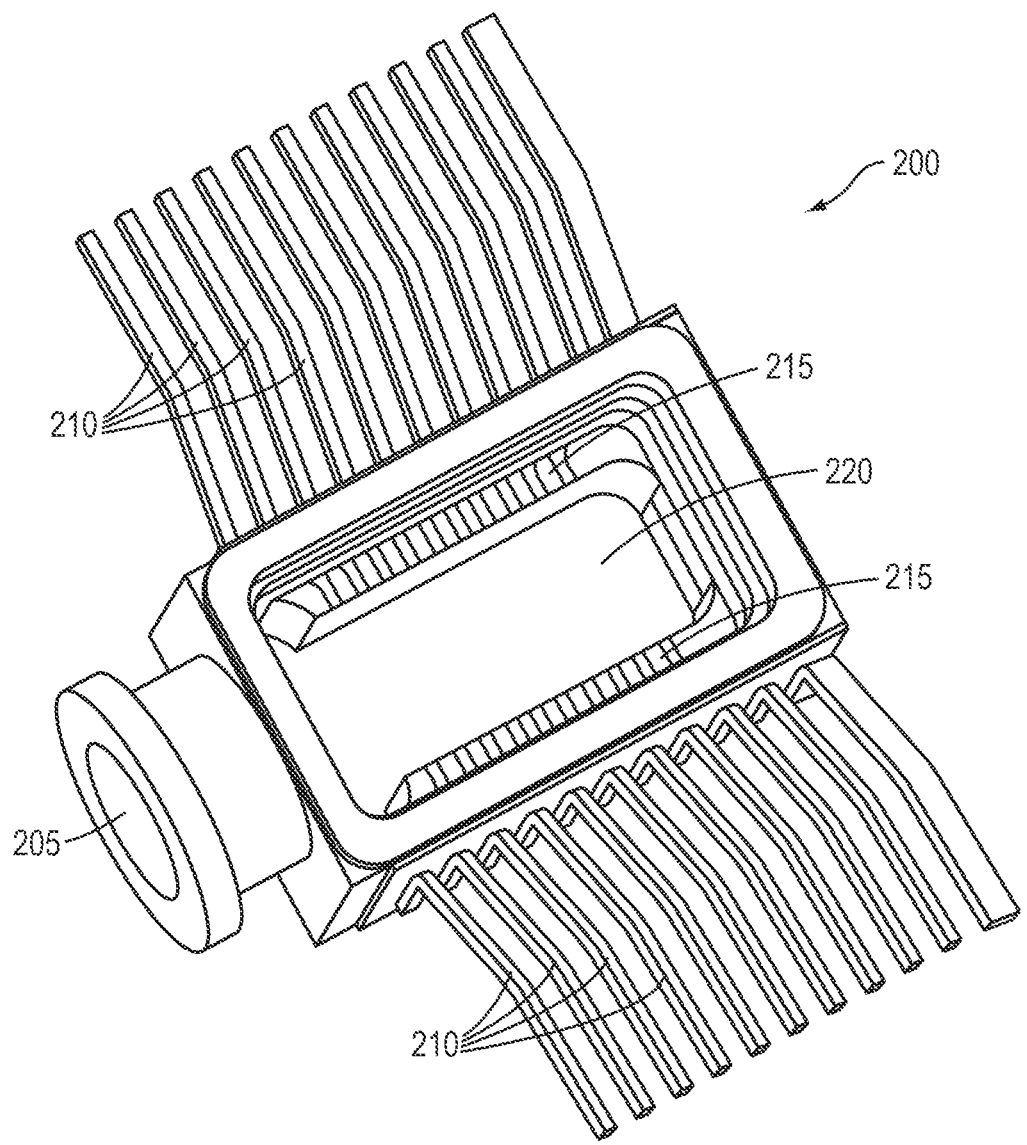
FIG. 2 shows a perspective view of a housing of a laser package, in accordance to one or more embodiments of the disclosure.

Refer to the example embodiment of FIG. 2, which illustrates a perspective view of a housing for a photonic integrated circuit assembly, in accordance to once or more embodiments of the disclosure. The housing 200 includes an optical connector 205, Pin connectors 210, input connectors 215, and an internal cavity 220 configured to receive a PIC assembly (130, FIG. 1). The housing 200 is enabled to electrically communicate and/or connect, via pin connectors 210, to a printed circuit board (PCB). The pin connectors 210 are connected to the input connectors 215 placed within the interior cavity of the housing 200. A PIC assembly (130, FIG. 1) is enabled to be disposed within the cavity 220 and electrically connected with the input connectors 215. A laser chip (not shown) is enabled to be used in conjunction with a PIC assembly (130, FIG. 1) to transmit and receive optical signals via optical connector 205.

Figure 3A:
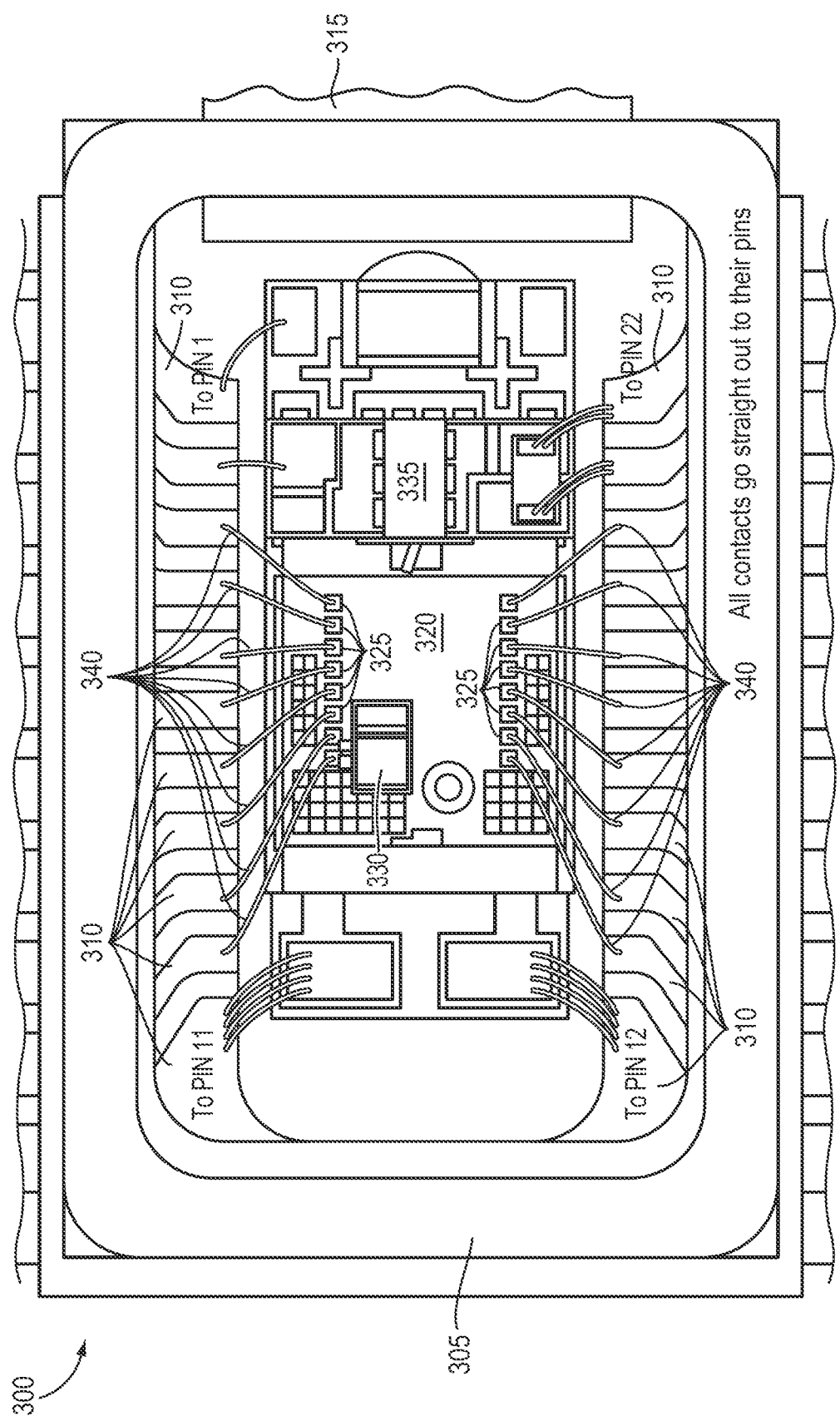
FIGS. 3A and 3B show various overhead views of an exemplary PIC installed or otherwise disposed within a housing, in accordance with one or more embodiments of the disclosure.
Figure 3B:
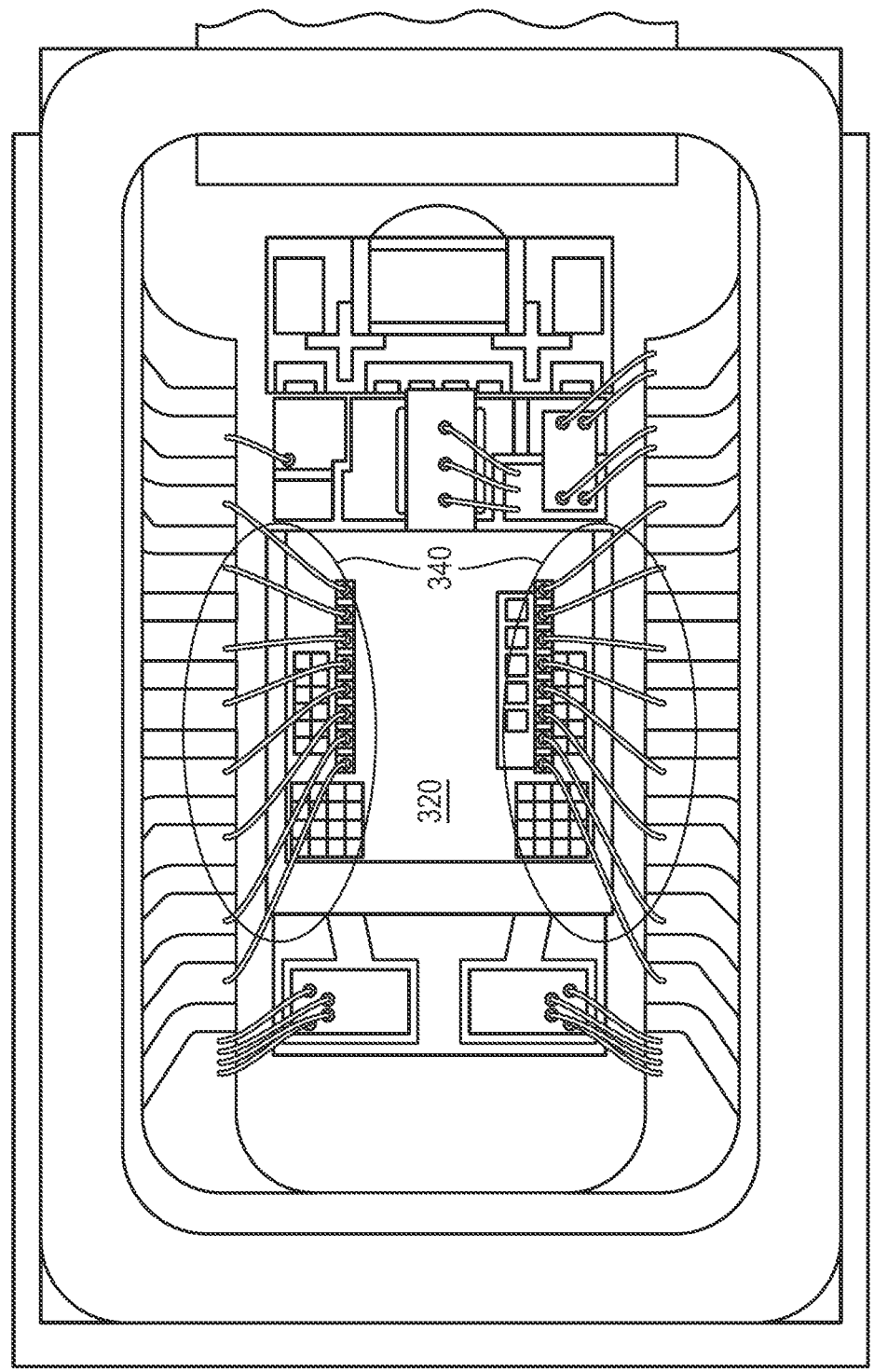

Refer to the example embodiments of FIGS. 3A and 3B, which illustrate an overhead view of a photonic integrated circuit assembly installed within a housing, in accordance with one or more embodiments of the disclosure. The housing 300 includes an outer wall 305 and an optical interface connection 315. On interior walls of the housing 300, are connection pads 310 electrically connected to external pins (210, FIG. 2), where the external pins (210, FIG. 2) protrude from the exterior of the housing 300. Disposed within the housing 300 is the PIC assembly (130, FIG. 1). As shown, a portion of the PIC assembly 130 includes a PIC 320 and a laser chip 335. The PIC 320 includes bond pads 325, which are placed inward from the edge of the PIC 320. This inward offset distance may range from about 0.4 mm to about 1.0 mm. A thermistor 330 is placed on the PIC 320 to determine temperature proximate to the PIC 320. To complete the connection between the PIC 320 and the housing 300, wire bonds 340 connect the bond pads 325 with the connection pads 310, thereby completing the electrical connection between the external pins (210, FIG. 2) and the PIC 320. The lengths of the wire bonds are increased as a result of the bond pads being moved inward relative to perimeter or edges of PIC.

Figure 4:
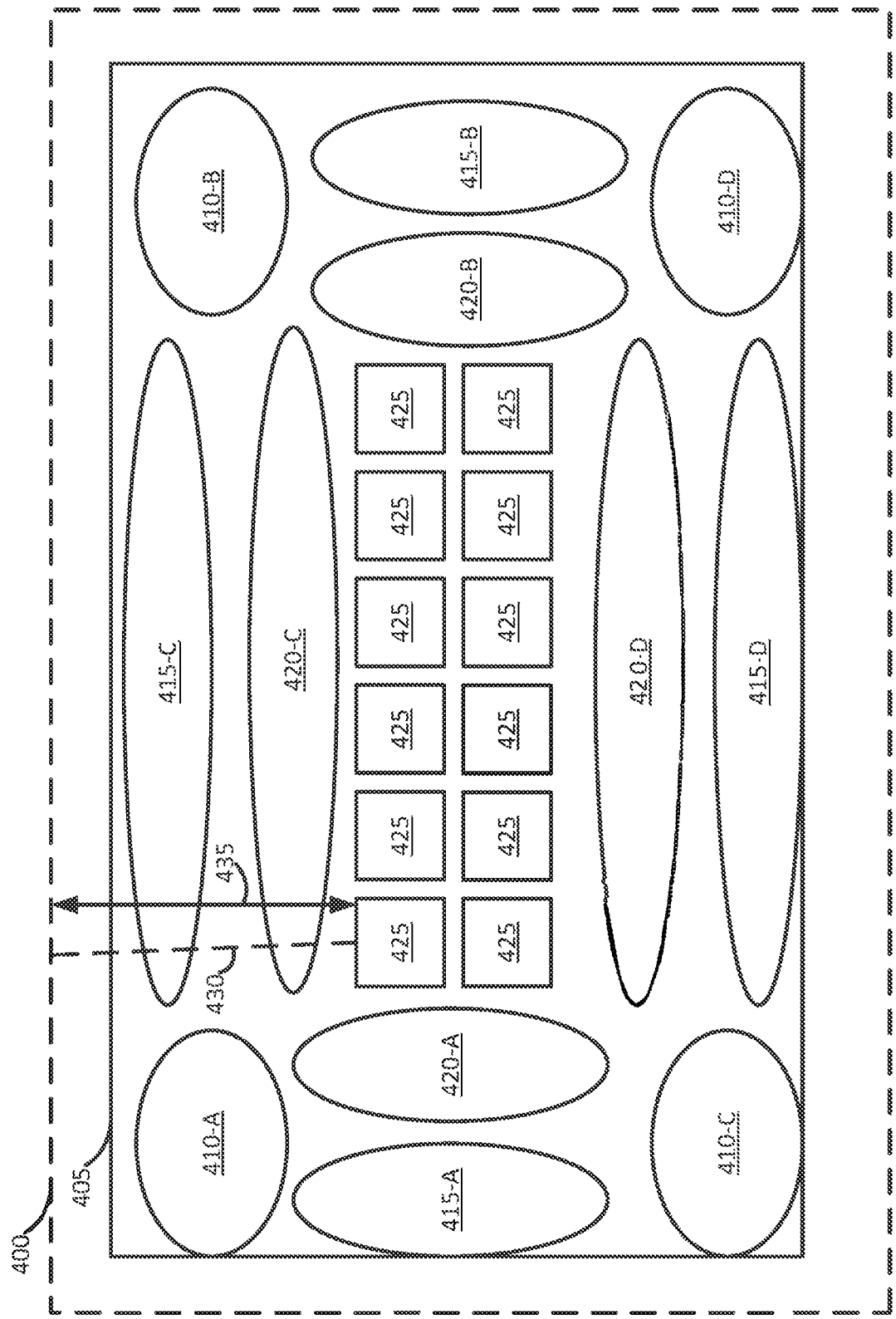
FIG. 4 shows a high level view of an exemplary PIC design, in accordance with an embodiment of the disclosure.

Refer to the example embodiment of FIG. 4, which illustrates an example design of a PIC, in accordance with one or more embodiments of the disclosure. As shown, the PIC 405 includes bond pads 425, regions (410A-D, 410 generally), regions (415A-D, 415 generally), and regions (420A-D, 420 generally). In many embodiments, temperature may fluctuate near bond pads. In various embodiments, temperature sensitive components may be further isolated from thermal crosstalk by increasing the distance between one or more of the bond pads and any temperature sensitive components (e.g., laser tuning components). Referring back to the embodiment of FIG. 4, bond pads 425 are centrally located. Thus, regions 410 and regions 415 are locations on the PIC 405 designated for temperature sensitive components, while components that are not temperature sensitive may be places in regions 420. In various embodiments, the bond pads may be moved incrementally closer or further from edges of a PIC. In these embodiments, regions for temperature sensitive components and regions for non-temperature sensitive components may be moved according to the bond pad placement. Referring back to the example embodiment of FIG. 4, dotted line 430 shows a wire lead of length 'L' connecting a bond pad 425 with housing 400. Line 435 indicates a distance between the bond pad 425 and the housing 400. In this embodiment, the length 'L' is longer then the distance shown by arrow 435. In various embodiments, each wire lead from a bond pad to an associated connection point at the housing is longer than an absolute distance 'L' from the bond pad to the associated connection point.

Figure 5:
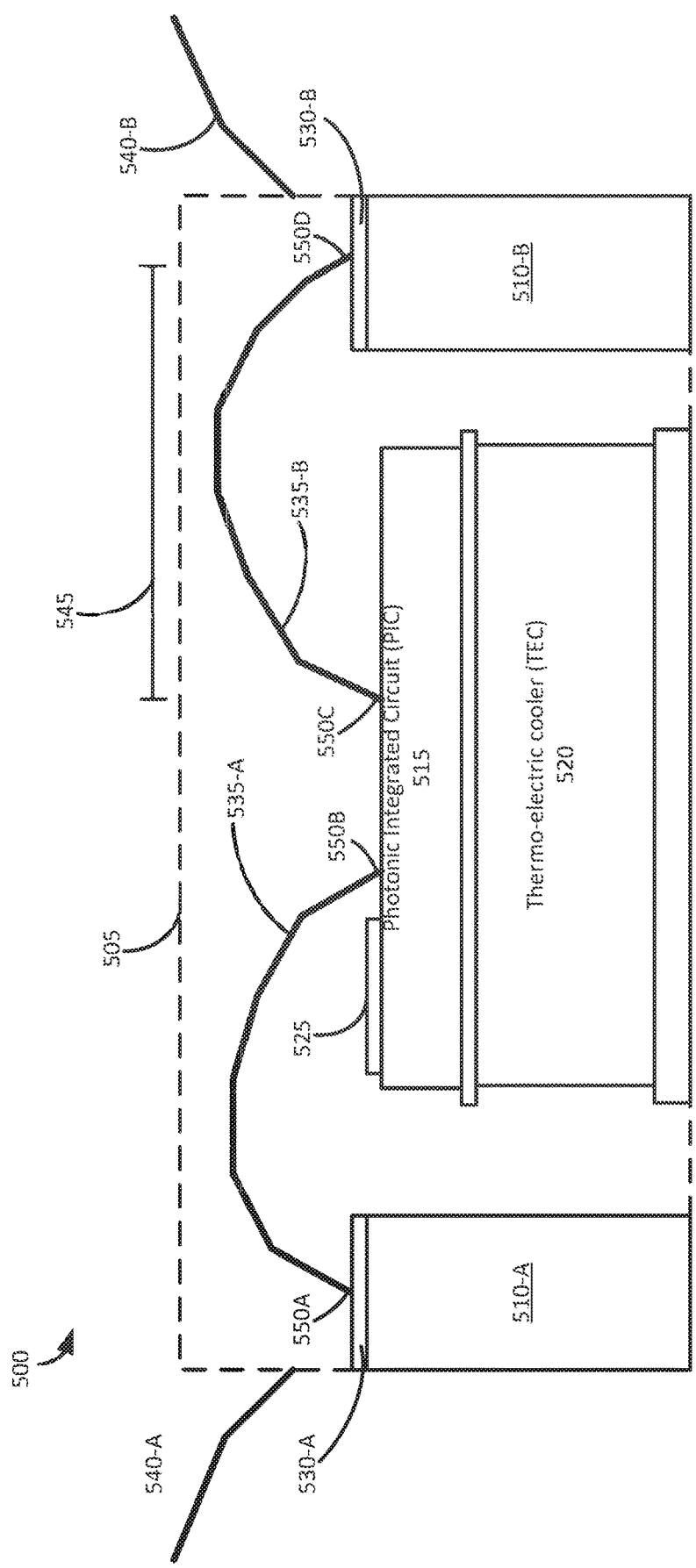
FIG. 5 shows a cross-sectional component view of a PIC assembly within a housing, in accordance with one or more embodiments of the disclosure.

Refer to the example embodiments of FIG. 5, which illustrates a cross-sectional component drawing of a PIC assembly within a housing, in accordance with one or more embodiments of the disclosure. As shown in FIG. 5, the housing 505 includes an interior wall (510A, 510B, 510 generally) and a PIC assembly that includes a thermoselectric cooler (TEC) 520, a Photonic Integrated Circuit (PIC) 515, and a thermistor 526. Atop each of the interior walls 510 of the housing 505, are internal pin connectors (530A, 530B, 530 generally), which are electrically connected to external pins (540A, 540B, 540 generally). As shown, the PIC 515 is electrically connected to each of the internal pin connectors 530 using leads and/or wire bonds (535A, 535B, 535 generally). In the embodiment of FIG. 5, each of the leads 535 connects at approximately the same height. In this instance, the distance between an internal pin connector 530-B and a bond pad on the PIC 515 is indicated by line 545, which is a distance 'D' that is equal to an absolute distance between the internal pin connector 530-B and the bond pad on the PIC 515. However, each lead (for example lead 535A) loops upward extending a length of each lead beyond an absolute distance between the PIC 515 and the internal pin connector 530. In this instance, lead 535-A connects to the internal pin connector 530-A, at first contact point 550A, and connects to the PIC 515 at second contact point 550B. Similarly, lead 535-B connects to the internal pin connector 530-B, at third contact point 550D, and forth contact point 550C at the PIC 515.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

Where a range or list of values is provided, each intervening value between the upper and lower limits of that range or list of values is individually contemplated and is encompassed within the disclosure as if each value were specifically enumerated herein. In addition, smaller ranges between and including the upper and lower limits of a given range are contemplated and encompassed within the disclosure. The listing of exemplary values or ranges is not a disclaimer of other values or ranges between and including the upper and lower limits of a given range.

Embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

What is claimed is:
1. An optical transceiver comprising:
a housing comprising an interior surface and exterior surface;
a plurality of pins extending outward from the exterior surface of the housing;
an interior volume at least partially enclosed within and defined by the housing;
a plurality of connectors disposed along the interior surface of the housing, the plurality of connectors electrically connected to the plurality of pins; and
a photonic integrated circuit (PIC) assembly comprising a PIC, the PIC comprising a plurality of bond pads, the PIC assembly disposed in the interior volume,
wherein the bond pads are disposed inward from an edge of the PIC a first distance, wherein the first distance is greater than about 0.4 mm,
wherein each of the bond pads is uniquely electrically connected to an associated connector of the plurality of connectors along the interior surface of the housing with a bond wire at least partially rounded across a distance between each of the bond pads and each associated connector, wherein a length of the bond wire is greater than a distance between each of the bond pads and the associated connector, wherein the length of the bond wire ranges from about 0.4 mm to about 2 mm.

2. The optical transceiver of claim 1, wherein the PIC assembly comprises a PIC comprising the plurality of bond pads, wherein the bond pads are disposed towards the center of the PIC.

3. The optical transceiver of claim 1, wherein the PIC comprises a region affected by a level of heat proximate to the region, wherein the region is disposed distally from each of the bond pads.

4. The optical transceiver of claim 1, wherein the length is selected to thermally isolate one or more components of the PIC such that during operation temperature variation of the PIC ranges from about 49 degrees to about 51 degrees.

5. The optical transceiver of claim 1, wherein the length ranges from about 0.4 mm to about 2 mm.

6. The optical transceiver of claim 1, wherein the length is greater than the distance between a first bond pad of the bond pads to a first connector of the connectors, wherein the first connector is associated with the first bond pad.

7. The optical transceiver of claim 1, wherein the length of the bond wire is about three times the distance between the PIC assembly and the interior surface of the housing.

8. The optical transceiver of claim 1, wherein the PIC further comprises a first region affected by a level of heat proximate to the first region, wherein the first region is disposed distally from each of the bond pads.

9. The optical transceiver of claim 1, wherein the PIC assembly further comprises a thermo-electric cooler (TEC), wherein the PIC is coupled to the TEC; a thermistor disposed on the PIC configured to provide feedback to the TEC based on a temperature detected by the thermistor; and a laser diode optically connected to the PIC.

\* \* \* \* \*